US011682543B2

(12) United States Patent
Takayoshi

(10) Patent No.: US 11,682,543 B2
(45) Date of Patent: Jun. 20, 2023

(54) PLASMA PROCESSING METHOD AND PLASMA PROCESSING APPARATUS

(71) Applicant: TOKYO ELECTRON LIMITED, Tokyo (JP)

(72) Inventor: Joji Takayoshi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 131 days.

(21) Appl. No.: 17/314,632

(22) Filed: May 7, 2021

(65) Prior Publication Data

US 2021/0351019 A1 Nov. 11, 2021

(30) Foreign Application Priority Data

May 7, 2020 (JP) .............................. JP2020-082134

(51) Int. Cl.
*H01J 37/32* (2006.01)

(52) U.S. Cl.
CPC .. *H01J 37/32642* (2013.01); *H01J 37/32174* (2013.01); *H01J 2237/334* (2013.01)

(58) Field of Classification Search
CPC ............ H01L 21/6833; H01J 2237/334; H01J 37/32715; H01J 37/32642; H01J 37/32174
See application file for complete search history.

(56) References Cited

U.S. PATENT DOCUMENTS

| 2022/0157561 A1* | 5/2022 | Cui | .................. | H01J 37/32027 |
| 2022/0223386 A1* | 7/2022 | Cui | .................. | H01L 21/68735 |
| 2022/0319811 A1* | 10/2022 | Cui | ........................ | H01J 37/321 |

FOREIGN PATENT DOCUMENTS

| JP | 2007-258417 A | 10/2007 |
| JP | 2019-145729 A | 8/2019 |

* cited by examiner

*Primary Examiner* — Raymond R Chai
(74) *Attorney, Agent, or Firm* — Weihrouch IP

(57) ABSTRACT

A plasma processing method is provided. In the plasma processing method, plasma is generated inside a chamber. A DC voltage is applied to an edge ring disposed to surround a substrate while generating the plasma. A first voltage of the edge ring is acquired while applying the DC voltage. Then, the application of the DC voltage is stopped. A second voltage of the edge ring is acquired while stopping the application of the DC voltage. Then, a parameter for controlling the DC voltage is calculated based on the first voltage and the second voltage.

11 Claims, 8 Drawing Sheets

PLASMA PROCESSING METHOD AND PLASMA PROCESSING APPARATUS

CROSS-REFERENCE TO RELATED APPLICATIONS

This application claims priority to Japanese Patent Application No. 2020-082134, filed on May 7, 2020, the entire contents of which are incorporated herein by reference.

TECHNICAL FIELD

The present disclosure relates to a plasma processing method and a plasma processing apparatus.

BACKGROUND

For example, Japanese Patent Application Publication Nos. 2007-258417 and 2019-145729 disclose a plasma processing apparatus in which an edge ring is provided to surround a substrate placed on a substrate support and a DC voltage is applied to the edge ring.

SUMMARY

The present disclosure provides a technique capable of applying a DC voltage to an edge ring while suppressing a shift in plasma characteristics occurring over the entire substrate.

In accordance with an aspect of the present disclosure, there is provided a plasma processing method including: (a) generating plasma inside a chamber; (b) applying a DC voltage to an edge ring disposed to surround a substrate while generating the plasma; (c) acquiring a first voltage of the edge ring while applying the DC voltage; (d) stopping the application of the DC voltage; (e) acquiring a second voltage of the edge ring while stopping the application of the DC voltage; and (f) calculating a parameter for controlling the DC voltage based on the first voltage and the second voltage.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
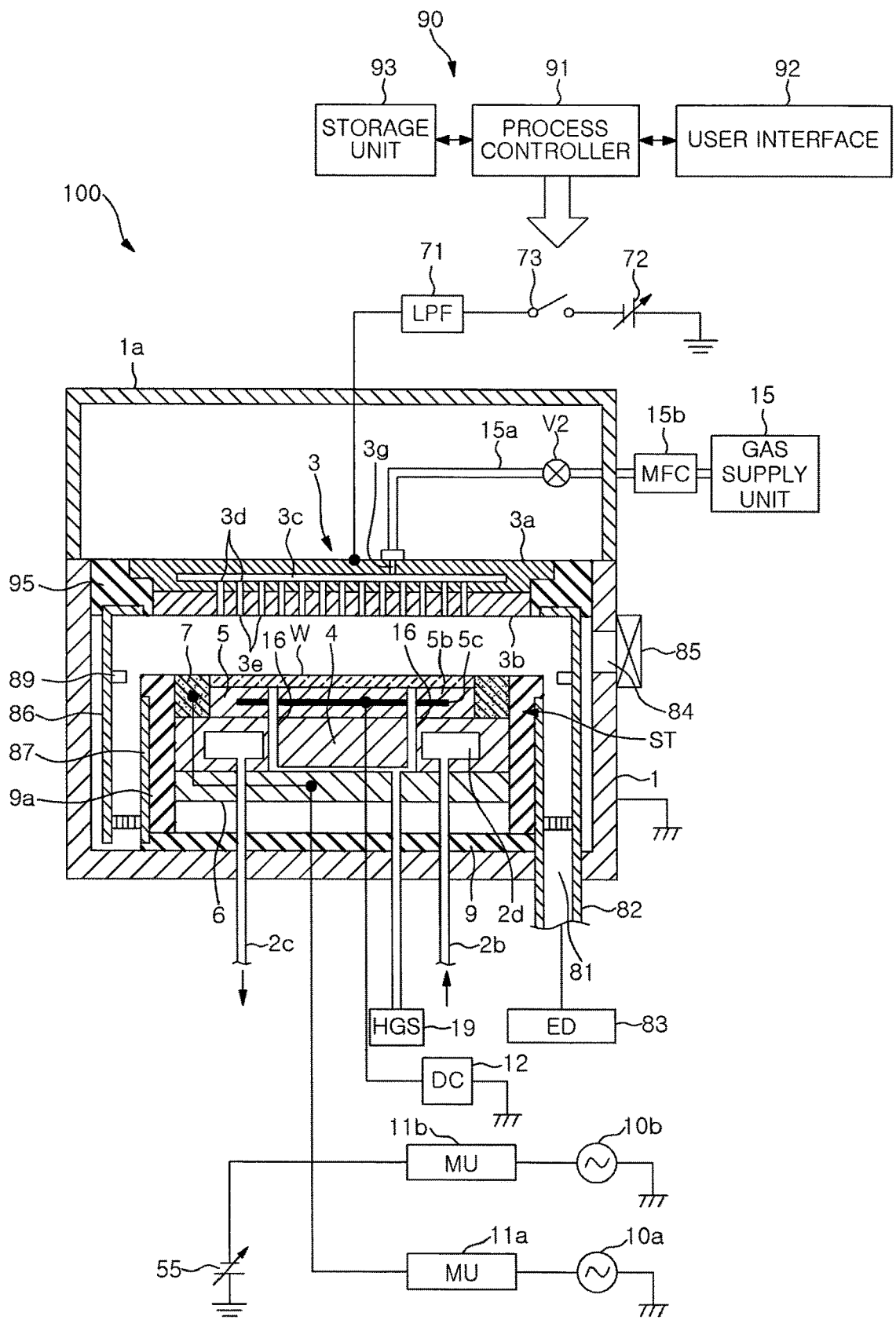
FIG. 1 is a cross-sectional view schematically showing a plasma processing apparatus according to an embodiment.

Hereinafter, embodiments of the present disclosure will be described with reference to the accompanying drawings. Throughout the drawings, like reference numerals will be given to like or corresponding parts, and redundant description thereof will be omitted.

<Plasma Processing Apparatus>

A plasma processing apparatus 100 according to an embodiment will be described with reference to FIG. 1. FIG. 1 is a cross-sectional view schematically showing the plasma processing apparatus 100 according to the embodiment. The plasma processing apparatus 100 includes a chamber 1 that is electrically grounded. The chamber 1 is formed in a cylindrical shape and made of, for example, aluminum. A substrate support ST on which a substrate W is placed is disposed in the chamber 1. The substrate support ST includes a first plate 4, a second plate 6, and an electrostatic chuck 5. The first plate 4 and the second plate 6 are made of, for example, aluminum. The electrostatic chuck 5 is made of, for example, a dielectric material. The first plate 4 is disposed on the second plate 6, and the electrostatic chuck 5 is disposed on the first plate 4.

An edge ring 7 made of, for example, silicon is disposed to surround the substrate W. The edge ring 7 is also referred to as a focus ring. A cylindrical inner wall member 9a is disposed to surround the edge ring 7, the first plate 4, and the second plate 6. The substrate support ST is disposed at a bottom portion of the chamber 1 through the inner wall member 9a and a support member 9 connected at a lower end of the inner wall member 9a. The support member 9 and the inner wall member 9a are made of, for example, quartz.

An electrode 5c in the electrostatic chuck 5 is embedded in a dielectric material 5b and connected to a DC power supply (DC) 12. When a DC voltage is applied from the DC power supply 12 to the electrode 5c, a Coulomb force is generated and the substrate W is electrostatically attracted to and held on the electrostatic chuck 5.

The first plate 4 includes a flow path 2d therein. A heat exchange medium, e.g., water, supplied from the chiller unit circulates through an inlet pipe 2b, the flow path 2d, and an outlet pipe 2c. A heat transfer gas supply path 16 is formed inside the substrate support ST. A heat transfer gas source (HGS) 19 supplies a heat transfer gas to the heat transfer gas supply path 16 to introduce the heat transfer gas into a space between a lower surface of the substrate W and the electrostatic chuck 5. The heat transfer gas to be introduced may be an inert gas such as helium (He) gas or argon (Ar) gas. The substrate support ST is provided with a pin insertion hole. A lifter pin(s) that is inserted into the pin insertion hole moves up and down by a lifting mechanism, so that the substrate W is vertically moved when the substrate W is transferred.

A first radio frequency (RF) power supply 10a is connected to the second plate 6 through a first matching unit (MU) 11a and a second RF power supply 10b is connected to the second plate 6 through a second matching unit (MU) 11b. The first RF power supply 10a applies RF power having a first frequency for plasma generation to the second plate 6. The second RF power supply 10*b* applies RF power having a second frequency lower than the first frequency for a bias voltage for drawing ions to the second plate 6. However, the RF power supplied from the second RF power supply 10*b* may be used for plasma generation.

The plasma processing apparatus 100 further includes a DC power supply 55. The DC power supply 55 is connected to the second plate 6 and is electrically connected to the edge ring 7 from the second plate 6 through the first plate 4. The DC power supply 55 supplies a DC voltage to the edge ring 7 to control a thickness of a sheath above the edge ring 7. The DC voltage applied to the edge ring 7 is controlled according to a consumption amount of the edge ring 7.

Above the substrate support ST, an upper electrode 3 facing the substrate support ST is provided. The upper electrode 3 has an electrode plate 3*b* and a ceiling plate 3*a*. An insulating annular member 95 that supports the upper electrode 3 is provided around the upper electrode 3. An upper opening of the chamber 1 is closed by the upper electrode 3 and the annular member 95. The ceiling plate 3*a* is made of a conductive material, for example, aluminum having an anodically oxidized surface. An electrode plate 3*b* is detachably held by the ceiling plate 3*a* under the ceiling plate 3*a*.

The ceiling plate 3*a* includes a gas diffusion space 3*c* and a gas inlet port 3*g* for introducing a processing gas into the gas diffusion space 3*c*. A gas supply pipe 15*a* is connected to the gas inlet port 3*g*. A gas supply unit 15, a mass flow controller (MFC) 15*b*, and an on/off valve V2 are connected to the gas supply pipe 15*a* in that order, and the processing gas is supplied from the gas supply unit 15 to the upper electrode 3 through the gas supply pipe 15*a*. The mass flow controller (MFC) 15*b* and on/off valve V2 are provided to control a gas flow and on/off of a gas supply.

A plurality of gas holes 3*d* extend toward the inside of the chamber 1 from the gas diffusion space 3*c* and communicate with a plurality of gas injection holes 3*e* formed in the electrode plate 3*b*. The processing gas is supplied in a shower-like manner from the gas injection holes 3*e* through the gas diffusion space 3*c* and the gas holes 3*d* into the chamber 1.

A DC power supply 72 is connected to the upper electrode 3 through a low-pass filter (LPF) 71. On/off of power supply output from the DC power supply 72 is controlled by a switch 73. When plasma of the processing gas is generated by applying the RF power from the first RF power supply 10*a* and the RF power from the second RF power supply 10*b* to the substrate support ST, the switch 73 is turned on and a desired DC voltage is applied to the upper electrode 3, if necessary.

A cylindrical ground conductor 1*a* is provided to extend upward from a sidewall of the chamber 1 to a position higher than a height of the upper electrode 3. The cylindrical ground conductor 1*a* has a ceiling wall at the top thereof.

An exhaust port 81 is formed at a bottom portion of the chamber 1. An exhaust device (ED) 83 is connected to the exhaust port 81 through an exhaust pipe 82. The exhaust device 83 has a vacuum pump. By operating the vacuum pump, a pressure in the chamber 1 is reduced to a predetermined vacuum level. A loading/unloading port 84 for the substrate W is provided at the sidewall of the chamber 1. The loading/unloading port 84 can be opened and closed by a gate valve 85.

A deposition shield 86 that is detachably installed extends along an inner surface of the sidewall of the chamber 1. Further, a deposition shield 87 that is detachably installed extends along the inner wall member 9*a*. The deposition shields 86 and 87 prevent etching by-products (deposits) from adhering to the inner surface of the sidewall and the inner wall member 9*a* of the chamber 1. A conductive member (GND block) 89 is provided at a portion of the deposition shield 86 at substantially the same height as the height of the substrate W. The conductive member 89 is connected such that a potential with respect to the ground can be controlled. Due to the presence of the GND block 89, abnormal discharge is prevented.

The plasma processing apparatus 100 is integrally controlled by the controller 90. The controller 90 includes a process controller 91 configured to control the respective components of the plasma processing apparatus 100, a user interface 92, and a storage unit 93.

The user interface 92 includes a keyboard through which a process manager inputs commands to operate the plasma processing apparatus 100, a display for visualizing and displaying an operating status of the plasma processing apparatus 100, and the like.

The storage unit 93 stores therein recipes including processing condition data and control programs (software) for causing the process controller 91 to execute various processes performed by the plasma processing apparatus 100. If necessary, a recipe is retrieved from the storage unit 93 in response to a command from the user interface 92 and executed by the process controller 91. Accordingly, a desired process is performed on the substrate W in the plasma processing apparatus 100 under the control of the controller 90. In addition, the recipes including the processing condition data and the control programs may be stored in a computer-readable storage medium or may be used online by transmitting the recipes, when necessary, from other devices through, for example, a dedicated line. Examples of the storage medium include a hard disk, a compact disk, a flexible disk, a semiconductor memory, and the like.

<Countermeasures Against Consumption of Edge Ring>

The edge ring 7 is exposed to plasma and is consumed during the processing of the substrate W. For example, when the substrate W is etched with a new edge ring 7, the edge ring 7 is disposed such that a plasma sheath (hereinafter referred to as "sheath") above the edge ring 7 has the same height as a height of a sheath above the substrate W, as shown by a solid line in FIG. 2. In this state, the ions in the plasma are vertically incident on the substrate W and form a vertically etched recess in an etching target film formed on the substrate W.

Figure 2:
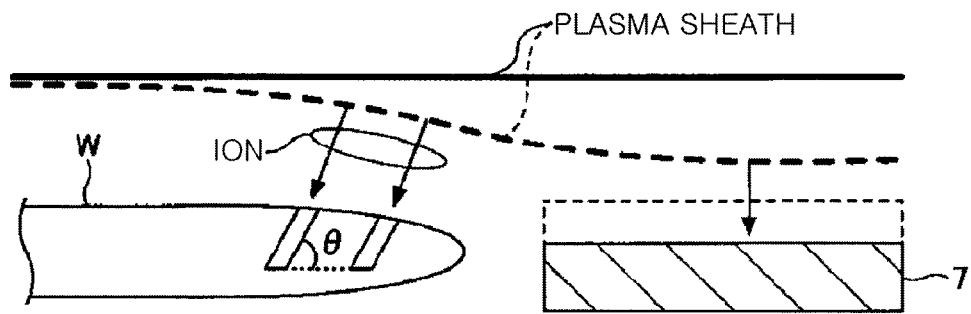
FIG. 2 is a diagram for explaining a slope of a tilting angle.

When the edge ring 7 is consumed, the height of the sheath above the edge ring 7 becomes lower than the height of the sheath above the substrate W, as shown by a dotted line in FIG. 2. Accordingly, the ions in the plasma are obliquely incident on a peripheral edge region of the substrate W and an obliquely tilted etching recess is formed in the etching target film formed on the substrate W. A tilting angle at this time is indicated by θ. An amount of change in the tilting angle θ varies depending on an incident angle of the ions. In other words, the amount of change in the tilting angle θ varies depending on a thickness of the sheath above the edge ring 7, that is, the consumption amount of the edge ring 7.

In order to obtain the vertically etched recess by allowing ions to be incident substantially at a right angle to the substrate W, the DC power supply 55 supplies a DC voltage to the edge ring 7 according to the consumption amount of the edge ring 7 to thereby control the thickness of the sheath above the edge ring 7. Accordingly, the sheath above the edge ring 7 can be adjusted to have the same height as the height of the sheath above the substrate W. As a result, the tilting angle θ can be controlled to about 90° and the vertically etched recess can be formed.

However, the magnitude of an RF current, which is supplied to the second plate 6 from the first and second RF power supplies 10a and 10b and flows in a plasma generation space through the first plate 4, changes between the case where the DC voltage is applied to the edge ring 7 and the case where the DC voltage is not applied. For example, when the DC voltage is not applied to the edge ring 7, the magnitude of RF current flowing on a center area of the substrate W and the magnitude of RF current flowing on an edge area of the substrate W are substantially the same. In contrast, when the DC voltage is applied to the edge ring 7, the magnitude of the RF current flowing on the center area of the substrate W becomes larger than the magnitude of the RF current flowing on the edge side of the substrate W. Therefore, the plasma density above the middle area including the center area of the substrate W becomes high. As a result, the following problems arise.

At first, even though it is desired to control the plasma characteristics of the peripheral edge region of the substrate W by applying a DC voltage to the edge ring 7, the plasma characteristics of the entire substrate W, that is, the central region, the peripheral region, and the peripheral edge region of the substrate W, are changed, which affects the processing of the entire substrate. For example, if the etching rate is shifted over the entire substrate, the quality of the processed substrate, that is the product quality, deteriorates. Therefore, it is necessary to minimize the shift of plasma characteristics occurring over the entire substrate.

Secondly, it is required to construct a method of applying a DC voltage to the edge ring 7 that minimizes the shift of the plasma characteristics occurring over the entire substrate and also allows the control to be performed with high accuracy in the peripheral edge region of the substrate W. For example, in performing a process including various steps on a single substrate, it is necessary to prevent the control of the DC voltage applied to the edge ring 7 from becoming complicated according to various processes (steps).

In view of the above, the plasma processing apparatus 100 according to the present embodiment provides a plasma processing method capable of uniformly controlling the DC voltage applied to the edge ring 7 while minimizing the shift of the plasma characteristics occurring over the entire substrate.

<DC Voltage Control Method in Reference Example>

Figure 3:
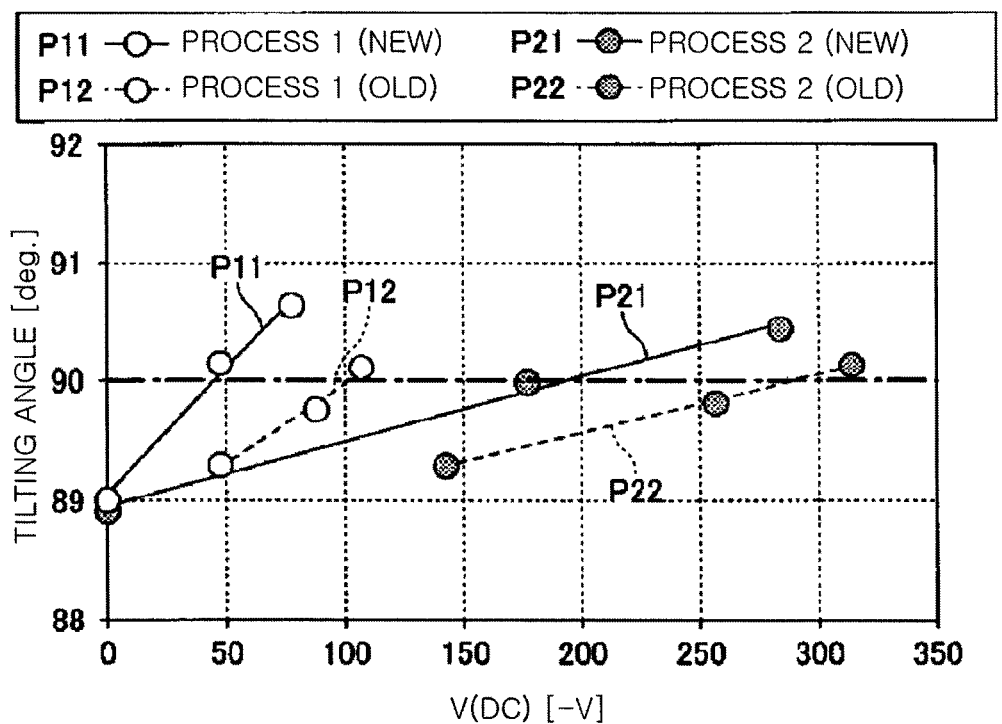
FIG. 3 shows an example of controlling a tilting angle and a DC voltage applied to an edge ring according to a reference example.

Before describing the present embodiment, a method of controlling a DC voltage applied to the edge ring 7 according to a reference example will be described with reference to FIG. 3. FIG. 3 shows an example of controlling a tilting angle and a DC voltage applied to the edge ring 7 according to the reference example. In FIG. 3, a horizontal axis indicates a DC voltage V applied to the edge ring 7 and a vertical axis indicates a tilting angle θ°. A value of the DC voltage V is referred to as V (DC). Simulation conditions of each process shown in FIG. 3 are as follows.

A process 1 (new) indicates a case where the process 1 under a given condition is performed on the substrate with a new edge ring 7. In this case, as shown by a solid line P11, the tilting θ can be adjusted to about 89° to 91° by controlling the DC voltage V (DC) applied to the edge ring 7 to about 0 to 75 [−V].

A process 1 (old) indicates a case where the process 1 under a given condition is performed on the substrate with a consumed edge ring 7 that is used for a predetermined time.

In this case, as shown by a dotted line P12, the tilting angle θ can be adjusted to about 89° to 91° by controlling the DC voltage V (DC) applied to the edge ring 7 to about 50 to 110 [−V].

A process 2 (new) indicates a case where the process 2 under a given condition that is different from the condition of the process 1 is performed on the substrate with a new edge ring 7. In this case, as shown by a solid line P21, the tilting angle θ can be adjusted to about 89° to 91° by controlling the DC voltage V (DC) applied to the edge ring 7 to about 0 to 280 [−V].

A process 2 (old) indicates a case where the process 2 under a given condition that is different from the condition of the process 1 is performed on the substrate with a consumed edge ring 7 that is used for a predetermined time. In this case, as shown by a dotted line P22, the tilting angle θ can be adjusted to about 89° to 91° by controlling the DC voltage V (DC) applied to the edge ring 7 to about 150 to 320 [−V].

Accordingly, in the DC voltage control method according to the reference example, the DC voltage applied to the edge ring 7 is controlled to be varied according to the process conditions in order to control the tilting angle θ to 90°. This is because the initial voltages at which the tilting angle θ becomes 90° differ depending on the process conditions and the slope of the tilting angle θ (that is, the sensitivity of the tilting angle θ) with respect to the applied DC voltages differs depending on the processes.

For example, in the process 1 (new), the initial DC voltage at which the tilting angle θ becomes 90° is about 50 [−V]. In the process 2 (new), the initial DC voltage at which the tilting angle θ becomes 90° is about 175 [−V]. Further, since the slope of the tilting angle θ is different between the process 1 and the process 2, even if the DC voltage is increased by the same amount from the initial DC voltage, the change in the tilting angle θ is different between the process 1 and the process 2. Therefore, the applied DC voltage required to adjust the tilting angle θ to 90° when the edge ring 7 is consumed is also different between the process 1 and the process 2.

From the above, in the control method of the reference example, it is necessary to apply an appropriate DC voltage to the edge ring 7 depending on the process condition and the consumption amount of the edge ring 7 for a recent process in which a wide variety of processes are performed. Thus, the control of the DC voltage applied to the edge ring 7 becomes complicated.

<DC Voltage Control Method According to the Present Embodiment>

In contrast, the DC voltage control method according to the present embodiment is capable of dealing with a wide variety of processes with a single index. Specifically, the present embodiment proposes a plasma processing method for controlling the DC voltage applied to the edge ring 7 by using a novel parameter for DC voltage control. When t represents a sheath thickness above the edge ring 7, the novel parameter used for controlling the DC voltage applied to the edge ring 7 in the present embodiment is denoted by a variation amount of the sheath thickness t.

An equation (1) for calculating the sheath thickness t is as follows:

⟨Equation (1)⟩

$$t = \frac{2}{3}\exp\left(\frac{1}{4}\right)\left(\frac{\varepsilon_0}{N_i}\right)^{\frac{1}{2}} V_{dc}^{\frac{3}{4}} \left(\frac{2}{ekT_e}\right)^{\frac{1}{4}} \quad (1)$$

where $V_{dc}$ is a self-bias voltage and $N_i$ is an ion density, and the ion density $N_i$ is equal to an electron density Ne of plasma and a plasma density. Further, $T_e$ is an electron temperature of the plasma, $\varepsilon_0$ is a vacuum permittivity, e is an elementary charge, k is the Boltzmann constant, and $\varepsilon_0$, e, and k are constant values. Among the variables included in the equation (1), the values of the ion density $N_i$, the self-bias voltage $V_{dc}$, and the electron temperature $T_e$ of the plasma change depending on the process condition.

Figure 4A:
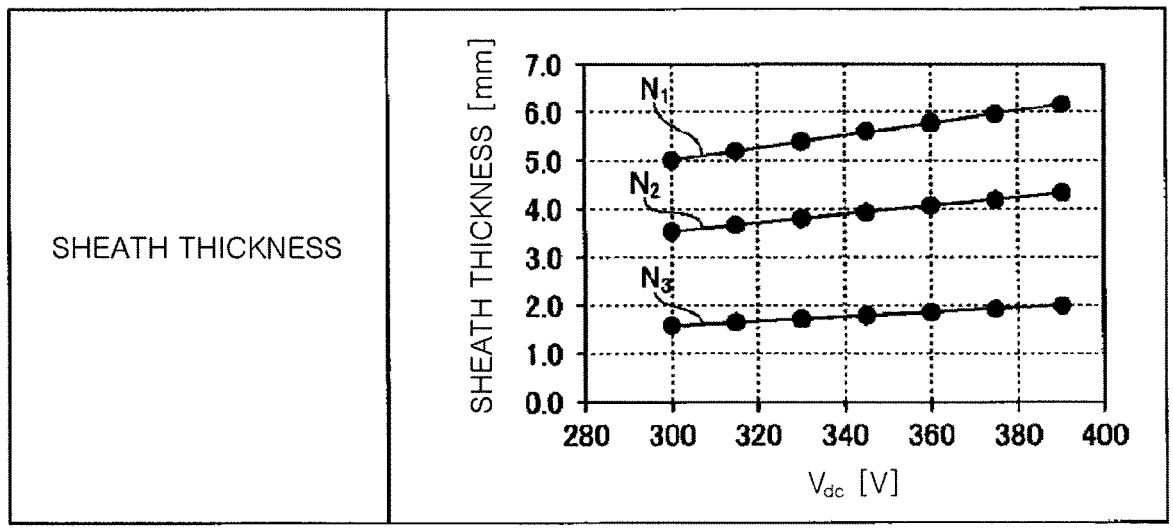
FIGS. 4A and 4B showing a variation amount of a sheath thickness according to the embodiment in comparison with the reference example.

Therefore, the sheath thickness t indicated on a vertical axis of a graph of FIG. 4A varies depending on the self-bias voltage $V_{dc}$ indicated on a horizontal axis of the graph and the values of $N_1$, $N_2$, and $N_3$, each of which is the ion density $N_i$ of each curve on the graph. The self-bias voltage $V_{dc}$ indicates the potential of the edge ring 7 and is equal to the potential of the substrate.

The variation amount of the sheath thickness, i.e., $\{(t_x-t)/t\}$, is converted as shown in an equation (2) based on the equation (1):

⟨Equation (2)⟩

$$\frac{t_X - t}{t} \times 100 = a \times 2V_{dc}\left(1 + \frac{X}{100}\right)^{\frac{3}{4}} \quad (2)$$

where $\{(t_x-t)/t\}\times 100$ indicates the amount of variation (%) in the sheath thickness, and a included in the equation (2) is a proportionality constant. Among the variables included in the equation (2), $V_{dc}$ is a self-bias voltage and X indicates a percentage change (%) of the DC voltage applied to the edge ring 7 in response to a percentage change (%) of the sheath thickness in order for the sheath thickness to be the same as an original thickness. X is a parameter for DC voltage control (hereinafter, also referred to as "parameter X").

In other words, "$\{(t_x-t)/t\}\times 100$", which is the variation amount of the sheath thickness, indicates a percentage change (%) of the sheath thickness when the DC voltage applied to the edge ring 7 is changed by X %. (1+X/100) on the right-hand side of the equation (2) is the sum of "1" for the self-bias voltage and "X/100," which is 1/100 of X % of the DC voltage applied to the edge ring 7, and the value of (1+X/100) is multiplied by the self-bias voltage $V_{dc}$ to calculate the potential of the edge ring 7. The equation (2) shows that the variation amount of the sheath thickness, i.e., $(t_x-t)/t$, can be uniformly controlled by controlling $V_{dc}(1+X/100)$ which is the potential of the edge ring 7.

Therefore, in the plasma processing method according to the present embodiment, the variation amount of the sheath thickness, i.e., $\{(t_x-t)/t\}$, is calculated using the equation (2). Referring back to FIG. 4A, in the DC voltage control method of the reference example, when the self-bias voltage $V_{dc}$ increases, the sheath thickness increases. Further, the sheath thickness is changed if the ion density $N_i$ is different. For example, when the self-bias voltage $V_{dc}$ on the horizontal axis is 300 [V], the sheath thickness is changed along with the different ion densities $N_i$ that are $N_1$, $N_2$, and $N_3$.

Figure 4B:
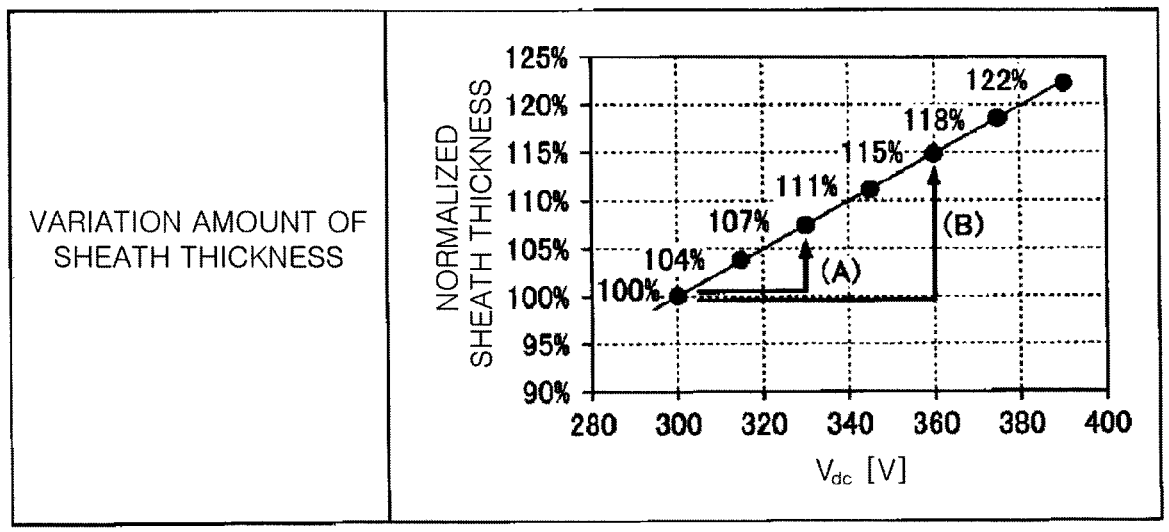

FIG. 4B shows the variation amount of the sheath thickness according to the embodiment in comparison with the reference example. A vertical axis of FIG. 4B shows the variation amount (%) of the sheath thickness normalized when the sheath thickness at the self-bias voltage $V_{dc}$ of 300 [V] on a horizontal axis of FIG. 4B is set to 100%. The arrow (A) in FIG. 4B indicates that the variation amount of the sheath thickness is increased by 11% from the initial value of the sheath thickness to 111% when 10(%) is substituted for X in the equation (2), that is, the self-bias voltage $V_{dc}$ is controlled to be increased by 10(%) from the initial value of 300 [V] to 330 [V]. The arrow (B) in FIG. 4B indicates the variation amount of the sheath thickness is increased by 18% from the initial value of the sheath thickness to 118% when 20(%) is substituted for X in the equation (2), that is, the self-bias voltage $V_{dc}$ is controlled from the initial value of 300 [V] to 360 [V]. In other words, in the plasma processing method according to the present embodiment, the variation amount of the sheath thickness, i.e., $\{(t_x-t)/t\}$, is controlled by using the equation (2). That is, by controlling X % of the DC voltage applied to the edge ring 7 among the potentials of the edge ring 7, even if the plasma density (ion density) changes, it is possible to control the variation amount of the sheath thickness with respect to the DC voltage applied to the edge ring 7 without being affected by the change of the plasma density.

Figure 5:
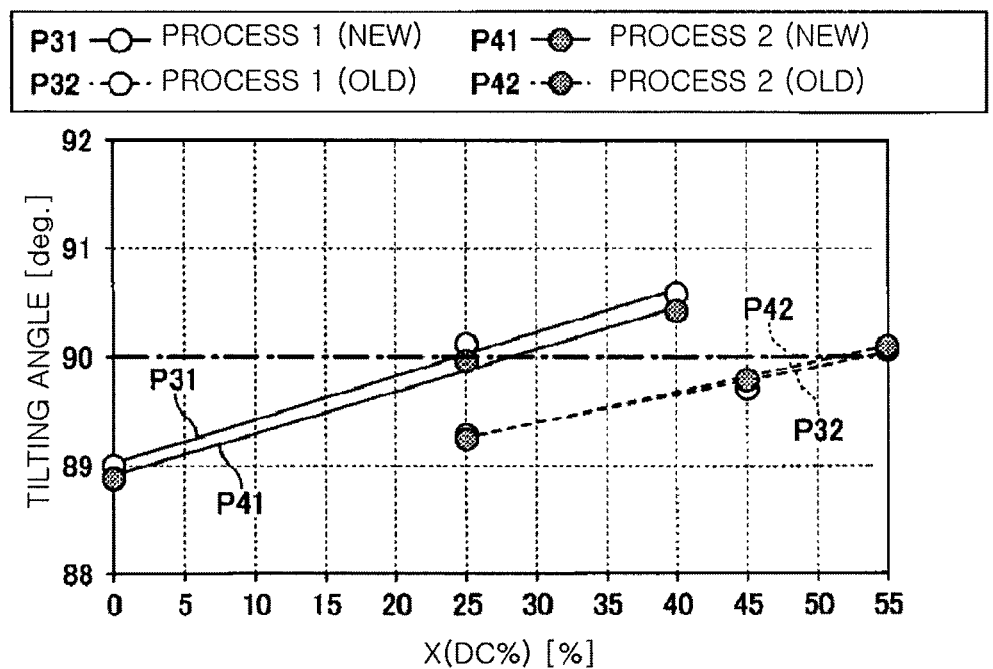
FIG. 5 shows an example of controlling a tilting angle and a DC voltage applied to an edge ring according to the embodiment.

FIG. 5 shows an example of controlling a DC voltage applied to the edge ring and a tilting angle according to the present embodiment by using the equation (2). On a horizontal axis of FIG. 5, X (%) of the DC voltage applied to the edge ring 7 represented by the equation (2) is expressed as X (DC %). X (DC %) is the same as the parameter X.

In FIG. 5, as in the reference example of FIG. 3, a vertical axis indicates the tilting angle θ (°). Simulation conditions for each of a process 1 (new), a process 1 (old), a process 2 (new), and a process 2 (old) are the same as those in FIG. 3.

In the process 1 with a new edge ring 7, as shown by a solid line P31, the tilting angle θ can be adjusted to about 89° to 91° by controlling the DC voltage X (DC %) to about 0 to 40 [%].

In the process 2 with a new edge ring 7, as shown by a solid line P41, the tilting angle θ can be adjusted to about 89° to 91° by controlling the DC voltage X (DC %) to about 0 to 40 [%].

In the process 1 with a consumed edge ring 7 that is used for a predetermined time, as shown by a dotted line P32, the tilting angle θ can be adjusted to about 89° to 91° by controlling the DC voltage X (DC %) to about 25 to 55 [%].

In the process 2 with a consumed edge ring 7 that is used for a predetermined time, as shown by a dotted line P42, the tilting angle θ can be adjusted to about 89° to 91° by controlling the DC voltage X (DC %) to about 25 to 55 [%]. As described above, in the processing method according to the present embodiment, the DC voltage applied to the edge ring 7 is controlled by using the parameter X (DC voltage X (DC %)), so that the tilting angle θ can be uniformly controlled according to the consumption amount of the edge ring even when the process conditions are different.

Figure 6:
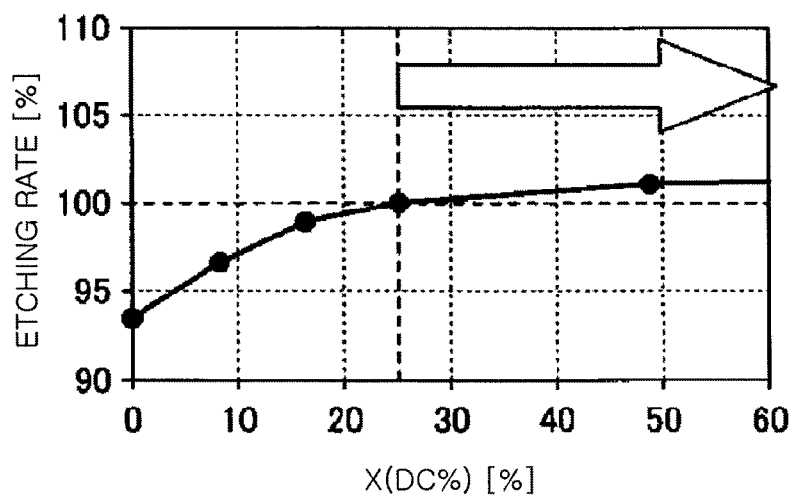
FIG. 6 shows an example of a DC voltage X (DC %) and an etching rate based on the variation amount of the sheath thickness according to the embodiment.

FIG. 6 shows an example of a DC voltage X (DC %) and an etching rate based on the variation amount of the sheath thickness according to the present embodiment. A horizontal axis of FIG. 6 represents the DC voltage X (DC %) in the equation (2) and a vertical axis represents the etching rate of the center of a resist film on the substrate. FIG. 6 is an example of a simulation result under different process conditions of the processes 1 and 2 in FIG. 5, and by normalizing the etching rate (%), the same result can be obtained under the different process conditions of the processes 1 and 2. In the processes 1 and 2, when the edge ring 7 is new, the DC voltage X (DC %) is set to 0. In the processes 1 and 2, the etching rate changes when the DC voltage X (DC %) is in a range of 0 to 25%.

From the above, even under the different process conditions of the processes 1 and 2 in FIG. 5, by controlling the DC voltage X (DC %) to 25% or more, the fluctuation (change) of the etching rate (%) is prevented and the shift of the process characteristics can be suppressed or minimized. Further, by controlling the DC voltage X (DC %), the etching rate at the center of the resist film can be uniformly controlled even in the different processes 1 and 2.

As described above, by controlling the DC voltage X (DC %) corresponding to the variation amount of the sheath thickness, the DC voltage applied to the edge ring 7 can be uniformly controlled in response to a wide variety of processes having different plasma densities due to different process conditions.

<Parameter for DC Voltage Control>

Figure 7:
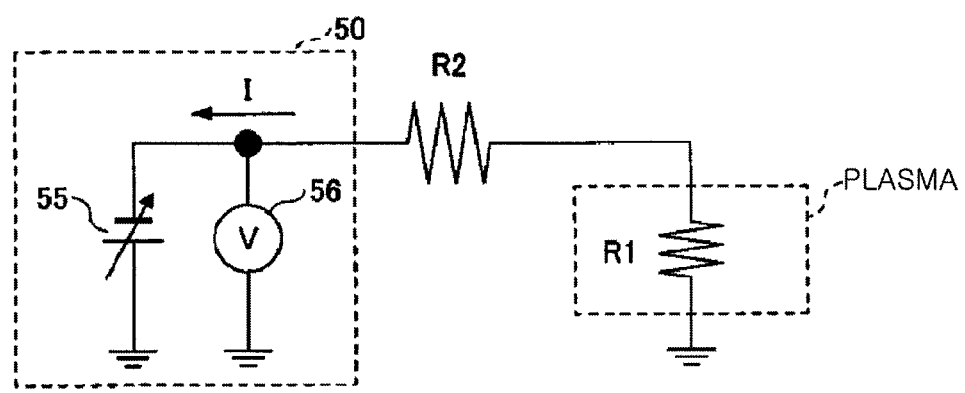
FIG. 7 shows an example of a measurement circuit according to the embodiment.

Next, the calculation of the parameter X (DC voltage X (DC %)) for controlling the DC voltage applied to the edge ring 7 in the plasma processing method according to the present embodiment will be described with reference to FIG. 7. FIG. 7 shows an example of a measurement circuit for acquiring the parameter X according to the present embodiment.

The plasma has a resistance of the self-biased voltage $V_{dc}$ and a resistance of the sheath, which are shown as R1 in FIG. 7. A resistance of the power supply line from the plasma to a FRDC generator 50 and a resistance of the mounting table ST is indicated as R2 (fixed value).

The FRDC generator 50 is configured to control a DC power supply 55 that applies a DC voltage to the edge ring 7 and a voltmeter 56 that monitors the voltage applied to the edge ring 7. With the formula of V=IR, the resistance R1 of the plasma is proportional to the potential of the edge ring 7. When no DC voltage is applied to the edge ring 7, the potential of the edge ring 7 is equal to the self-bias voltage $V_{dc}$. When a DC voltage is applied to the edge ring 7, the potential of the edge ring 7 is equal to the sum of two voltages of the self-bias voltage $V_{dc}$ and the DC voltage applied to the edge ring 7.

Further, the resistance of the plasma is determined by the sheath thickness. A part of the sheath thickness corresponds to the self-bias voltage $V_{dc}$ from plasma, and when a DC voltage is applied to the edge ring 7, a part of the sheath thickness corresponds to the DC voltage applied to the edge ring 7. R2 is a fixed value. Therefore, from the two voltages of the self-bias voltage $V_{dc}$ and the DC voltage applied to the edge ring 7, the potential of the edge ring 7 in each of the case where the DC voltage is applied to the edge ring 7 and the case where the DC voltage is not applied is proportional to the resistance of the plasma. Since the resistance of the plasma is determined by the sheath thickness, the voltage drop of the edge ring 7 in each of the case where the DC voltage is applied to the edge ring 7 and the case where the DC voltage is not applied becomes the variation amount of the sheath thickness.

Figure 8:
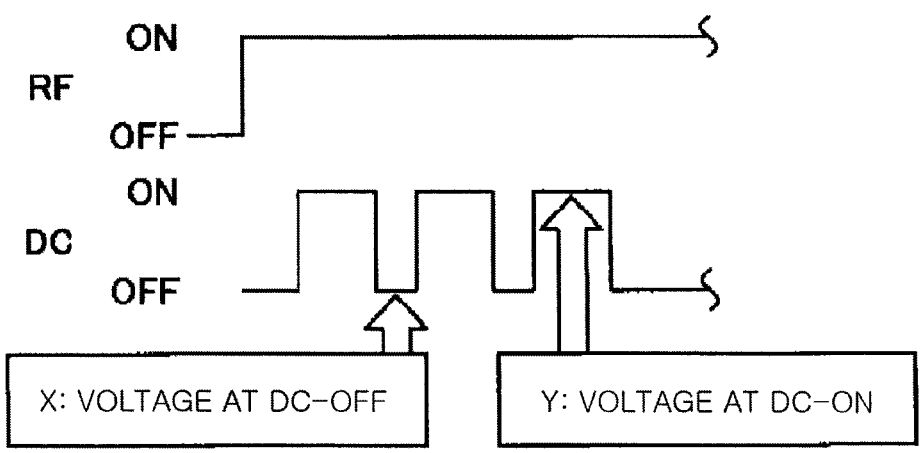
FIG. 8 is a diagram for explaining a measurement method according to the embodiment.

Therefore, the potential of the edge ring 7 is measured by the voltmeter 56 for each of the case where the DC voltage is applied to the edge ring 7 and the case where the DC voltage is not applied to the edge ring 7, and the data used for calculating the parameter X (DC %) for DC voltage control is obtained. FIG. 8 is a diagram for explaining a measurement method according to the present embodiment.

In FIG. 8, RF is the second RF power supplied from the second RF power supply 10b of FIG. 1. DC is the DC voltage applied from the DC power supply 55.

The measurement is performed during the generation of the plasma while the substrate is being processed. That is, during the measurement, the first RF power supplied from the first RF power supply 10a is continuously applied and the plasma is maintained such that the substrate processing is performed. During the substrate processing, the DC voltage indicated by DC is applied to the edge ring 7 in a pulsed manner. That is, the DC voltage applied to the edge ring 7 is repeatedly switched on and off.

The voltmeter 56 measures the potential of the edge ring 7 while the DC voltage is applied to the edge ring 7 (DC-ON) and while the DC voltage is not applied (DC-OFF). As shown in FIG. 8, the voltage measured by the voltmeter 56 while the DC voltage is applied to the edge ring 7 is denoted by Y, and the voltage measured by the voltmeter 56 while the DC voltage is not applied to the edge ring 7 is denoted by X.

The voltmeter 56 may measure the voltage one time or a plurality of times when the DC voltage is applied to the edge ring 7 in a pulsed manner. Further, the voltmeter 56 may measure the voltage one time or a plurality of times when the DC voltage is not applied to the edge ring 7.

When the DC voltage is applied to the edge ring 7, the voltmeter 56 measures the potential including the self-bias voltage $V_{dc}$ and the DC voltage applied to the edge ring 7 as the potential of the edge ring 7. When no DC voltage is applied to the edge ring 7, the voltmeter 56 measures the potential of the self-bias voltage $V_{dc}$ as the potential of the edge ring 7.

<Plasma Processing Method>

Figure 9:
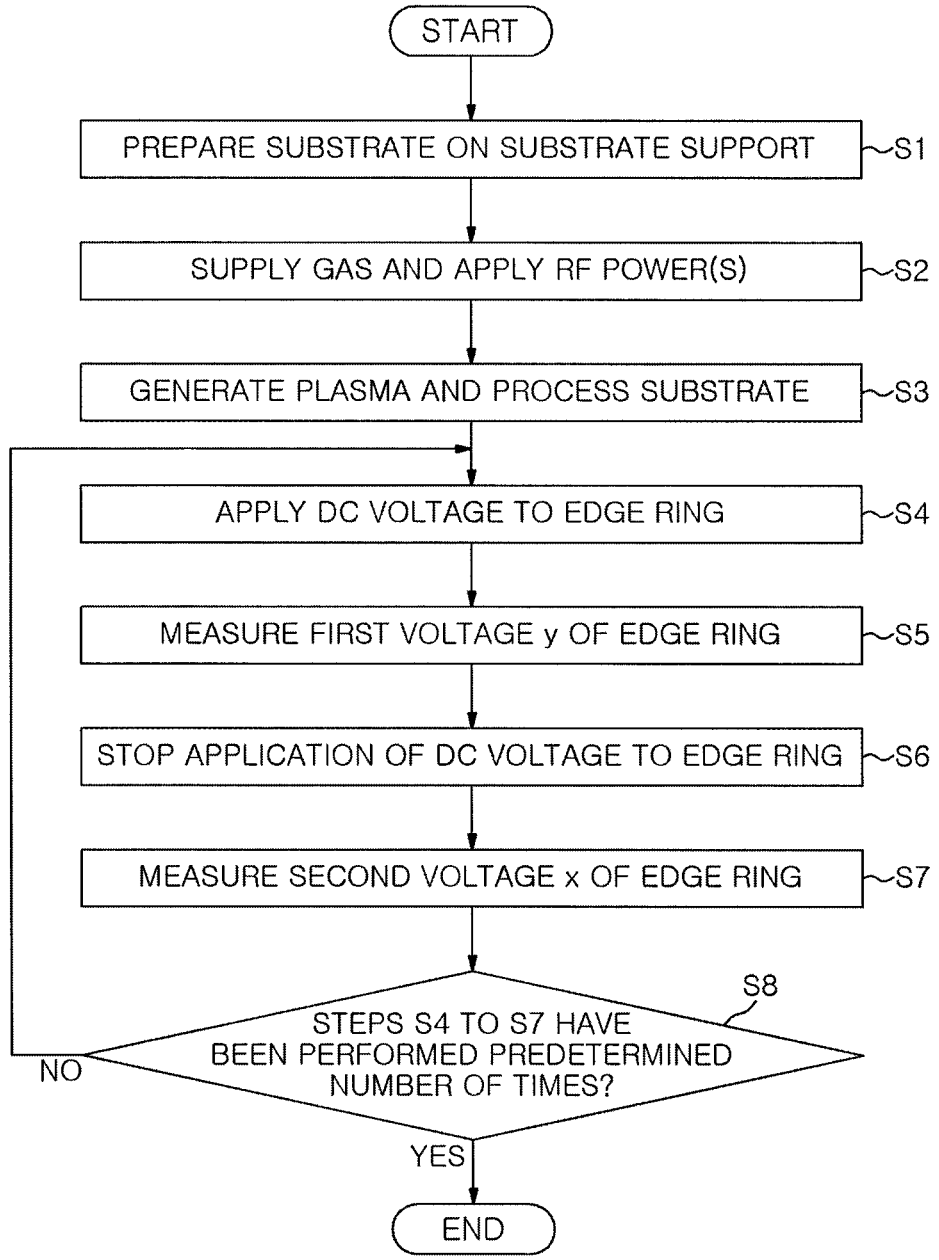
FIG. 9 is a flowchart showing a plasma processing method (a voltage measurement of the edge ring) according to the embodiment.
Figure 10:
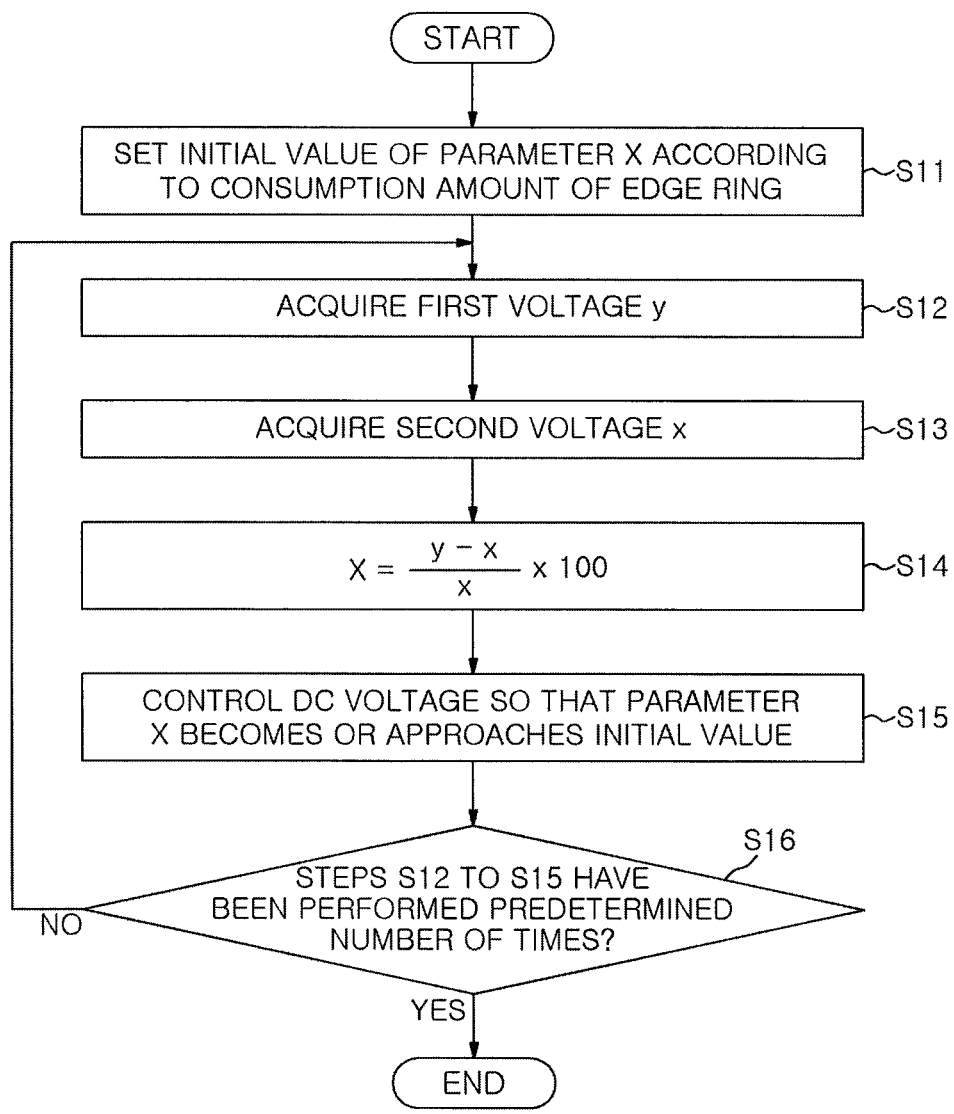
FIG. 10 is a flowchart showing the plasma processing method (a calculation of a parameter) according to the embodiment.

The plasma processing method including the processing of the above-described measurement according to the present embodiment will be described with reference to FIGS. 9 and 10. FIG. 9 is a flowchart showing the voltage measurement of an edge ring in the plasma processing method according to the embodiment. FIG. 10 is a flowchart showing the calculation of the parameter in the plasma processing method according to the embodiment. The plasma processing method according to the present embodiment is controlled under the control of the controller 90 and performed by using the plasma processing apparatus 100.

When the process of FIG. 9 is started, the controller 90 prepares the substrate W to be placed on the substrate support ST (step S1). Next, the controller 90 controls the gas supply unit 15 to supply a processing gas for processing the substrate W. Further, the controller 90 controls the first RF power supply 10a and the second RF power supply 10b to respectively apply the first RF power and the second RF power to the substrate support ST (step S2). As a result, plasma is generated and the controller 90 processes the substrate W with the generated plasma (step S3).

Next, the controller 90 applies a DC voltage to the edge ring 7 during the generation of plasma (step S4). Next, the controller 90 controls the voltmeter 56 to measure the potential of the edge ring 7 as a first voltage y during the application of the DC voltage (step S5).

Next, the controller 90 stops the application of the DC voltage to the edge ring 7 (step S6). Next, the controller 90 controls the voltmeter 56 to measure the potential of the edge ring 7 as a second voltage x while stopping the application of the DC voltage (step S7).

Next, the controller 90 determines whether steps S4 to S7 have been performed a predetermined number of times (step S8). The predetermined number of times is set in advance and may be one or more times. If the controller 90 determines that steps S4 to S7 have not been performed the predetermined number of times, the controller 90 returns to step S4 and repeats steps S4 to S7. If the controller 90 determines that steps S4 to S7 have been performed the predetermined number of times, the controller 90 terminates the process.

Next, a method of calculating the parameter X for the DC voltage control in the plasma processing method according to the embodiment shown in FIG. 10 will be described. The process of FIG. 10 is executed after the process of FIG. 9 is performed.

When the process of FIG. 10 is started, the controller 90 sets an initial value of the parameter X according to the consumption amount of the edge ring 7 (step S11). The initial value of the parameter X according to the consumption amount of the edge ring 7 may be stored in the storage unit 93 in advance. Next, the controller 90 acquires the first voltage y (step S12) and the second voltage x (step S13).

Next, the controller 90 calculates the parameter X based on the first voltage y and the second voltage x (step S14). The controller 90 calculates the parameter X (%) by multiplying a value, obtained by dividing the difference between the first voltage y and the second voltage x by the second voltage x, by 100. Next, the controller 90 determines and controls the DC voltage applied to the edge ring 7 so that the parameter X becomes or approaches the initial value of the parameter X set in step S11 (step S15).

Next, the controller 90 determines whether steps S12 to S15 have been performed a predetermined number of times (step S16). The predetermined number of times is set in advance and may be one or more times. If the controller 90 determines that steps S12 to S15 have not been performed the predetermined number of times, the controller 90 returns to step S12 and repeats the steps S12 to S15. If the controller 90 determines that steps S12 to S15 have been performed the predetermined number of times, the controller 90 terminates the process.

If the predetermined number of times in step S8 of FIG. is greater than one time, it is preferable that the predetermined number of times in step S16 of FIG. 10 is greater than one time. In this case, the step of applying the DC voltage to the edge ring and the step of stopping the application of the DC voltage are alternately repeated. Further, the measurement of the first voltage y of the edge ring 7 using the voltmeter 56 is repeated and the measurement of the second voltage x of the edge ring 7 using the voltmeter 56 is repeated.

If the predetermined number of times in step S16 of FIG. 10 is greater than one time, the parameter X for DC voltage control is calculated more than one time based on a plurality of first voltage y and a plurality of second voltage x obtained by repeating the corresponding steps in FIG. 9. Then, whenever the parameter X is calculated, the DC voltage applied to the edge ring 7 is determined so that the calculated parameter X becomes or approaches the initial value of the parameter X.

The controller 90 controls the DC voltage applied to the edge ring 7 to the voltage determined in step S15 in real time. Accordingly, the DC voltage applied to the edge ring 7 can be accurately controlled by using the parameter X for DC voltage control without being affected by the process conditions and the plasma density varying during the process. Since the potential of the edge ring 7 varies for each wafer and during the process, the DC voltage applied to the edge ring 7 is controlled in real time so that the control for the peripheral edge region of the substrate (for example, the control of the tilting angle θ) can be performed with high accuracy. Therefore, it is possible to suppress the shift of the plasma characteristics occurring over the entire substrate, suppress the variation in the etching rate and the critical dimension (CD) of the etched recess, and obtain the improved process characteristics. Further, it is also possible to suppress the oblique incidence of ions in the peripheral edge region of the substrate, thereby minimizing the displacement between the etching recess and the hole in an underlying layer.

Meanwhile, RF power application time and a consumption amount of the edge ring 7 may be measured in advance, and the correlation information therebetween may be stored in the storage unit 93 in advance. In this case, by referring to the storage unit 93, the consumption amount of the edge ring 7 is acquired from the RF power application time and the initial value of the parameter X is set based thereon. However, acquiring the consumption amount of the edge ring 7 is not limited thereto and the consumption amount of the edge ring 7 may be obtained by optically measuring the surface of the edge ring 7.

<Setting of Initial Value for Parameter>

Figure 11A:
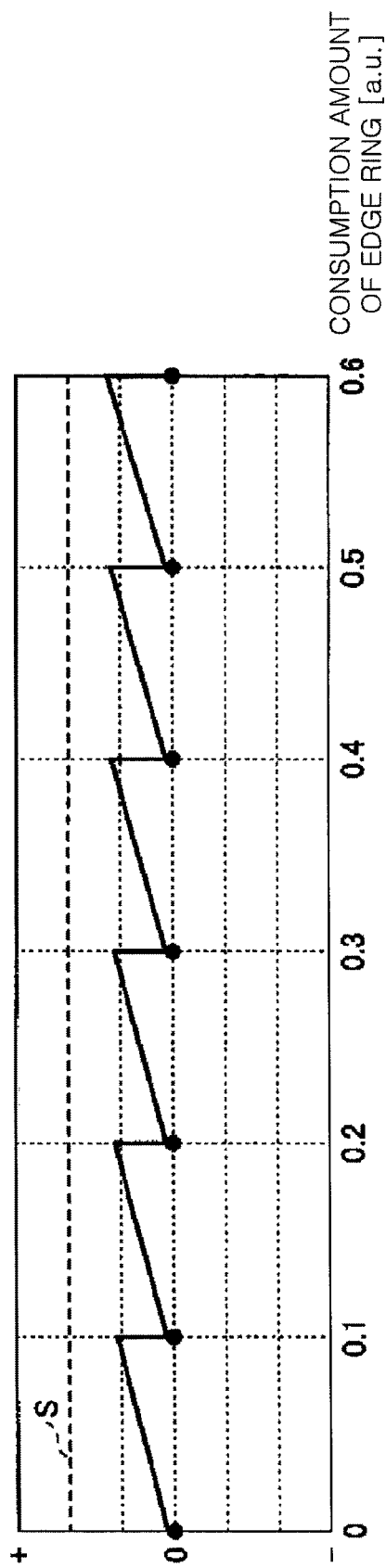
FIGS. 11A and 11B show an example of an initial value of the parameter and an amount of change in the tilting angle according to the embodiment.
Figure 11B:
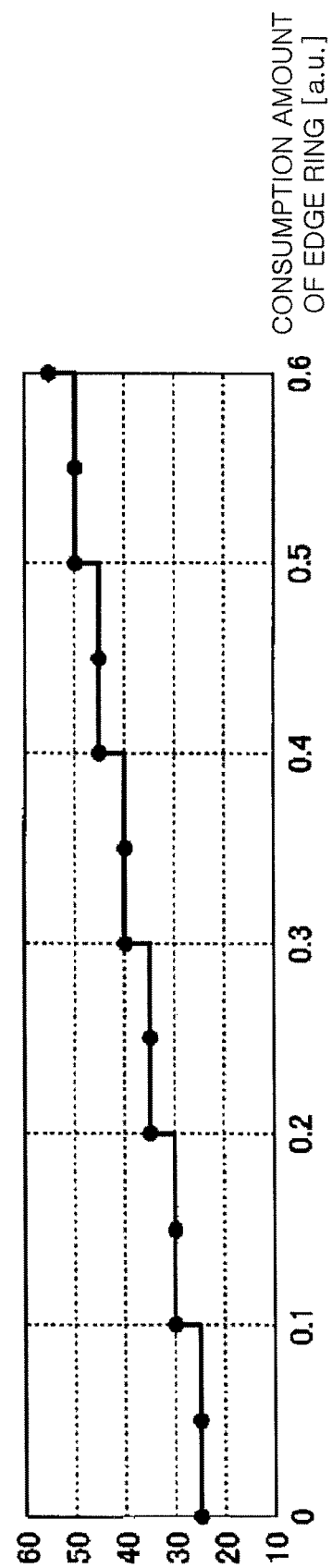

Finally, the setting of the initial value of the parameter X for DC voltage control will be described with reference to FIGS. 11A and 11B. FIGS. 11A and 11B show an example of initial values of the parameter X for DC voltage control according to the present embodiment.

In step 11 of FIG. 10, the initial value of the parameter X with respect to the consumption amount of the edge ring 7 is stored in advance in the storage unit 93, and, by referring to the storage unit 93, the initial value of the parameter X is obtained from the consumption amount of the edge ring 7.

However, instead of the consumption amount of the edge ring 7, the initial value of the parameter X with respect to the RF power application time may be stored in advance in the storage unit 93, and, by referring to the storage unit 93, the initial value of the parameter X is obtained from the RF power application time.

With such information, in step S11 of FIG. 10, the controller 90 sets the initial value of the parameter X based on not only the consumption amount of the edge ring 7 but also an index (for example, the RF power application time) indicating the consumption amount of the edge ring 7.

The controller 90 determines the value of the DC voltage so that the parameter calculated in steps S12 to S14 of FIG. 10 becomes or approaches the initial value of the parameter X in step S15. This makes it possible to improve the accuracy of controlling the DC voltage applied to the edge ring 7 according to the process conditions. In addition, the lifespan of the edge ring 7 can be extended.

For example, in FIG. 11B, the storage unit 93 stores in advance the setting in which the initial value of the parameter X indicated on a vertical axis is set to 25% while the consumption amount of the edge ring 7 on a horizontal axis is in a range of 0 to 0.1, and the initial value of the parameter X is increased by 5% in increments of 0.1. When the consumption amount of the edge ring 7 is 0, the edge ring 7 is new.

In FIG. 11A, the DC voltage applied to the edge ring 7 is controlled such that an amount of change in the tilting angle θ indicated on a vertical axis allows the parameter X to become or approach the initial value of "25%" in step S15 while the consumption amount of the edge ring 7 is in the range of 0 to 0.1.

Since the consumption amount of the edge ring 7 increases between 0 and 0.1, the amount of change in the tilting angle θ gradually increases from 0. When the amount of change in the tilting angle θ exceeds a predetermined upper limit value S, the tilting angle θ may be distant from 90° and the control accuracy for the peripheral edge region of the substrate W may decrease.

Therefore, when the consumption amount of the edge ring 7 becomes 0.1 or more, the initial value of the parameter X is changed to 30%. Then, in step S15, the DC voltage applied to the edge ring 7 is controlled so that the parameter calculated in steps S12 to S14 becomes or approaches the initial value "30%" of the parameter X.

By changing the initial value of the parameter X from 25% to 30%, the amount of change in the tilting angle θ indicated on the vertical axis of FIG. 11A is set to 0 because the amount of change in the tilting angle θ becomes discontinuous at the consumption amount of 0.1. By resetting the initial value of the parameter X in increments of 0.1 according to the consumption amount of the edge ring 7, the amount of change in the tilting angle θ does not exceed the predetermined upper limit value S and the deviation of the tilting angle θ from 90° can be reduced. Thus, the decrease in control accuracy for the peripheral edge region of the substrate W can be suppressed.

The setting of the initial value of the parameter X is not limited to the example of FIG. 11B. For example, increasing the initial value of the parameter X is not limited to the case where the initial value of the parameter X is increased in increments of 5%. Further, in the method of calculating the initial value of the parameter X, the initial value of the parameter X is calculated from the relationship between the variation amount of the sheath thickness, i.e., $\{(t_x-t)/t\} \times 100$ and X (%) indicating the increase of the DC voltage applied to the edge ring 7 in % based on the equation (2).

Although the plasma processing method and the plasma processing apparatus according to the above-described embodiments have been described, the substrate support, the plasma processing method and the plasma processing apparatus of the present disclosure are not limited to those in the above-described embodiments, and various modifications and improvements can be made within the scope of the present disclosure. The above-described embodiment and the modified examples can be combined without contradicting processing contents thereof.

For example, the substrate support according to the above-described embodiment and the modified example has the electrostatic chuck. However, the present disclosure is not limited thereto, and, for example, the substrate support may not have the electrostatic chuck. In this case, the support portion of the substrate support does not have the function of the electrostatic chuck and the substrate is placed on the upper surface of the mounting portion.

The plasma processing apparatus according to the present disclosure can be applied to any type of apparatus using capacitively coupled plasma (CCP), inductively coupled plasma (ICP), a radial line slot antenna, electron cyclotron resonance (ECR) Plasma, and helicon wave plasma (HWP). The plasma processing method according to the present disclosure can be performed by the plasma processing apparatus including a chamber having a plasma space, a substrate support disposed in the plasma space, and a plasma generating unit configured to form plasma from a gas supplied to the plasma space.

The invention claimed is:

1. A plasma processing method comprising:
   (a) generating plasma inside a chamber;
   (b) applying a DC voltage to an edge ring disposed to surround a substrate while generating the plasma;
   (c) acquiring a first voltage of the edge ring while applying the DC voltage;
   (d) stopping the application of the DC voltage;
   (e) acquiring a second voltage of the edge ring while stopping the application of the DC voltage; and
   (f) calculating a parameter for controlling the DC voltage based on the first voltage and the second voltage.

2. The plasma processing method of claim 1, further comprising:
   (g) determining a value of the DC voltage applied to the edge ring based on the parameter.

3. The plasma processing method of claim 2, wherein, in (f), a value of the parameter is calculated by dividing a difference between the first voltage and the second voltage by the second voltage.

4. The plasma processing method of claim 3, further comprising:
   (h) setting an initial value of the parameter based on a consumption amount of the edge ring or an index indicating the consumption amount of the edge ring,
   wherein, in (f), a value of the DC voltage is determined so that the calculated parameter becomes or approaches the initial value of the parameter.

5. The plasma processing method of claim 4, further comprising:
   alternately repeating (b) and (d),
   wherein (c) is repeated after (b) and (e) is repeated after (d), and
   the parameter for controlling the DC voltage is calculated more than one time based on the acquired first voltages and the acquired second voltages.

6. The plasma processing method of claim 2, further comprising:
   (h) setting an initial value of the parameter based on a consumption amount of the edge ring or an index indicating the consumption amount of the edge ring,
   wherein, in (f), a value of the DC voltage is determined so that the calculated parameter becomes or approaches the initial value of the parameter.

7. The plasma processing method of claim 6, further comprising:
   alternately repeating (b) and (d),
   wherein (c) is repeated after (b) and (e) is repeated after (d), and
   the parameter for controlling the DC voltage is calculated more than one time based on the acquired first voltages and the acquired second voltages.

8. The plasma processing method of claim 1, wherein, in (f), a value of the parameter is calculated by dividing a difference between the first voltage and the second voltage by the second voltage.

9. The plasma processing method of claim 1, further comprising:
   (h) setting an initial value of the parameter based on a consumption amount of the edge ring or an index indicating the consumption amount of the edge ring,
   wherein, in (f), a value of the DC voltage is determined so that the calculated parameter becomes or approaches the initial value of the parameter.

10. The plasma processing method of claim 9, further comprising:
    alternately repeating (b) and (d),
    wherein (c) is repeated after (b) and (e) is repeated after (d), and the parameter for controlling the DC voltage is calculated more than one time based on the acquired first voltages and the acquired second voltages.

11. A plasma processing apparatus comprising:
a chamber;
an edge ring disposed to surround a substrate; and
a controller,
wherein the controller executes
(a) generating plasma inside the chamber;
(b) applying a DC voltage to an edge ring disposed to surround the substrate while generating the plasma;
(c) acquiring a first voltage of the edge ring while applying the DC voltage;
(d) stopping the application of the DC voltage;
(e) acquiring a second voltage of the edge ring while stopping the application of the DC voltage; and
(f) calculating a parameter for controlling the DC voltage based on the first voltage and the second voltage.

\* \* \* \* \*